THERMOELECTRIC BONDING MATERIAL

Filed Jan. 17, 1962 2 Sheets-Sheet 1

INVENTOR.
IAN M. RITCHIE
BY
Ezekiel Wolf, Wolf & Greenfield
ATTORNEYS

Feb. 1, 1966 I. M. RITCHIE 3,232,719

THERMOELECTRIC BONDING MATERIAL

Filed Jan. 17, 1962

2 Sheets-Sheet 2

INVENTOR.
IAN M. RITCHIE

BY *Ezekiel Wolf, Wolf & Greenfield*

ATTORNEYS

United States Patent Office 3,232,719

Patented Feb. 1, 1966

3,232,719

THERMOELECTRIC BONDING MATERIAL

Ian M. Ritchie, Wakefield, Mass., assignor to Transitron Electronic Corporation, Wakefield, Mass., a corporation of Delaware Filed Jan. 17, 1962, Ser. No. 166,896

14 Claims. (Cl. 29—195)

The invention relates to means for electrically contacting semimetallic, thermoelectric compositions such as lead and selenium, tellurium and/or sulphur systems. As stated in United States Letters Patent No. 2,811,569, issued to Fritts et al. on October 29, 1957, a major obstacle in using electrical conductors of the semimetallic alloy type referred to above for thermoelectric purposes has been "the difficulty of making electrical contact to the conductors without encountering an alloying or solution of the electrode in the conductors. Such alloying or solution between the electrical conductor and the electrode causes a change in composition of the electrical conductor which generally results in the reduction of the high thermoelectric power, hence, such alloying or solution must be controllably restricted if uniformity of the electrical properties and long life of the electrical conductor are desired." It is further suggested that material used in contacting the electrodes and the thermoelectric material must not dissolve one in the other at any temperature within the operating range of the device.

Unfortunately, most metals commonly considered to be electrode materials will readily alloy, and thereby poison selenium, tellurium and sulphur compounds. Fritts et al. supra, offers to solve the problems partially referred to above by providing a contact electrode of iron. However, iron as a contact electrode is not an altogether satisfactory solution. Bonds to iron must be made at temperatures in the range of 900° C., to 1000° C. Since this temperature range exceeds the melting point of such thermoelectric materials the bond must be effected by a localized melting process which requires extreme care and control to avoid melting the entire thermoelectric device. In addition, bonding in a temperature range of 900° C. to 1000° C. substantially increases the problems relating to oxidation in which oxide films tenaciously adhere to the contact electrodes.

In addition to avoiding problems inherent in the use of iron as a contacting electrode, it is also desirable to provide a very low resistivity bonding material for bonding the thermoelectric device to an electrode. In order to attain a low resistivity bond it is important to provide a bonding material which does not contain impurities capable of diffusing into and poisoning the thermoelectric material, and which will not deteriorate either by degradation of electrical properties or by mechanical cracking. Nor should the material forming the contacting electrode diffuse into the bonding alloy in sufficient quantity to deleteriously affect the bond to the thermoelectric material. Consequently, the bonding material should not materially change the Seebeck coefficient of the thermoelectric material and should not decrease the overall thermoelectric figure of merit.

Of particular difficulty is the bonding of a P-type lead telluride, usually doped with sodium, to a contact electrode. Oxides readily form on such thermoelectric material to impair or prevent the formation of a satisfactory bond. This problem is partially solved by carrying out all operations in a reducing atmosphere, since such thermoelectric material oxidizes very quickly.

Another object of the present invention is to provide a bonding material for a thermoelectric material and contact electrode which is particularly adapted for commerical manufacture.

One other object of the present invention is to provide a bonding material for thermoelectric materials and contacting electrodes which minimizes problems of cracking due to differential thermal expansions or thermal expansion mismatches.

A further object of the present invention is to provide a material for bonding thermoelectric devices and contact electrodes which will operate over a wide range of temperatures without affecting the thermal or electrical characteristics of the thermoelectric device.

The present invention overcomes the foregoing problems by providing a bonding material or alloy for use in connection with both P and N-type thermoelectric materials of various thermoelectric systems. For example, metal-nonmetal thermoelectric alloys which have as their principal constituents at least one element selected from the group consisting of lead, tin or germanium (hereafter defined as the metal group), and at least one element selected from the group consisting of tellurium, selenium and sulphur (hereafter defined as the nonmetal group), are primarily useful in this invention. In the present invention there is provided a bonding material or alloy consisting of a unique mixture of metal and nonmetal elements in selected atomic proportions, with the metal selected from the group consisting of calcium, strontium, barium, lead, germanium, tin, manganese, beryllium, vanadium, ytterbium and zinc and the nonmetal selected from the group consisting of tellurium, selenium and sulphur. As defined in this connection, "unique mixture" refers to a composition of the aforesaid metals and nonmetals which has but a single stable stoichiometric arrangement. The bonding material should have a melting point lower than, but close to the melting point of the thermoelectric material to which it is bonded. If the melting point is too close to the melting point of the thermoelectric material, bonding must take place by localized melting of the thermoelectric material which is not a satisfactory process. If the melting point is too low it may coincide with the operating temperature of the device itself and thereby be unstable. Moreover diffusion of bonding material impurities into the thermoelectric material is greatly enhanced near the melting point. It is preferable to select a bonding material which may be secured to the thermoelectric composition at a temperature approximately 50° below the melting point of the thermoelectric material.

In the case of lead telluride thermoelectrics, a melting point for the bonding material in the range of approximately 500° C. to 875° C. is preferred, and in the case of tin telluride a melting point in the range of 500° C. to 740° C. is preferred.

These and other objects and advantages of the present invention will be more clearly understood when considered in conjunction with the accompanying drawings, in which.

Figure 1:
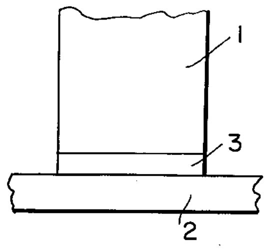
FIG. 1 is a schematic diagram of a thermoelectric material bonded to a contact electrode by means of a bonding material or alloy.

In FIG. 1 there is schematically illustrated a bond between a thermoelectric material or alloy 1 and a contacting electrode 2 using a bonding material or alloy 3. The contacting electrode 2 preferably may comprise iron or low carbon steel or other material which will not readily diffuse into the bonding material or affect the thermoelectric qualities of the device.

The thermoelectric material 1 to which this invention is directed, preferably comprises a metal-nonmetal composition having as its principal constituents at least one metal, A, selected from the group consisting of lead, tin and germanium and at least one nonmetal, B, selected from the group consisting of tellurium, selenium and sulphur. These thermoelectric materials are suitably doped to form P or N type materials and may consist of a stoichiometric system having doping agents contained therein, such for example, as the type described in copending patent application Serial No. 53,657, filed September 2, 1960, for an invention in "Means and Method of Making Lead Telluride," by Beverley A. Shaw, or may alternately consist of thermoelectrically conductive compositions such as described in United States Letters Patent Nos. 2,811,440, and 2,811,411, both issued October 29, 1957.

In addition to the foregoing thermoelectric system, other systems of metals and nonmetals may have utility in connection with this invention. For example, a thermoelectric system consisting of the metals A, bismuth, antimony and arsenic, and the nonmetals, B, selenium, tellurium and sulphur in mixtures of metals and nonmetals, may also be used. A system of the metals, A, gallium and indium, and nonmetals, B, antimony and arsenic, may also be used. Also contemplated are ternary thermoelectric systems, such as silver, antimony, telluride, Ag, Sb, $Te_2$, provided they otherwise comply with the limitations set forth herein. In particular the present invention is useful in bonding to iron or low carbon steel electrodes. The bonding material 3 must have several electrical, chemical and physical characteristics to be compatible with the thermoelectric material and electrodes referred to above. The thermoelectric material referred to above is normally P-type or N-type depending upon its doping.

With this in mind it has been found that a bonding material must be either neutral or inherently of the same N- or P-type as the thermoelectric material to which it is to be bonded. A metallic element M, which forms a compound $M_xR_y$ with the nonmetallic portion R of the thermoelectric material will tend to be an N-type dope when present as an impurity if *x*, a whole integer is greater than *y*, a whole integer. The compound $M_xR_y$ will also tend to an N-type dope. Conversely if *x* is less than *y*, both the element and the compound will tend to act as P-type doping impurities.

With the foregoing in mind, it is postulated that if an alloy, for bonding purposes, consists of the formula $M_xR_y$, and where $M_xR_y$ is a unique mixture, the metal-nonmetal compounds defined thereby will include all of those compounds which are suitable as bonding materials or alloys. By unique mixture we mean a metal-nonmetal system of the formula $M_xR_y$ which has but a single stoichiometric arrangement. The formula $M_xR_y$ is further limited in the present invention to a system in which M is selected from the group consisting of calcium, strontium, barium, lead, germanium, tin, manganese, beryllium, vanadium, ytterbium and zinc, and R is selected from the group consisting of tellurium, selenium and sulphur.

The mono-tellurides, mono-selenides and mono-sulphur compounds which may come within the definitions set forth above, include: calcium telluride, strontium telluride, barium telluride, lead telluride, germanium telluride, tin telluride, manganese telluride, beryllium telluride, zinc telluride, ytterbium telluride and vanadium telluride; calcium selenide, strontium selenide, barium selenide, lead selenide, germanium selenide, tin selenide, manganese selenide, beryllium selenide, zinc selenide, ytterbium selenide and vanadium selenide; calcium sulphide, strontium sulphide, barium sulphide, lead sulphide, germanium sulphide, tin sulphide, manganese sulphide, beryllium sulphide, zinc sulphide, ytterbium sulphide, and vanadium sulphide.

In addition to the foregoing limitation on selection of the bonding material it is important to select a bonding material which does not have high sensitivity and which will not form high resistivity barriers at the interfaces of the contacting electrode 2 and the thermoelectric alloy 1 with the bonding material 3. This may be accomplished, preferably, by reflecting a bonding material of the unique mixture $M_xR_y$, for the thermoelectric material $A_cB_d$ in which $x=c$ and $y=d$, and in which *x*, *y*, *c* and *d* are whole integers representing atomic proportions. Thus, for example, if the thermoelectric material is lead telluride, PbTe, an ideal bonding material would be SnTe.

If $Bi_2Te_3$ is the thermoelectric material, $As_2Te_3$ may preferably be used as a bonding material.

If InSb is the thermoelectric material, GaSb may preferably be used as a bonding material.

If $AgSbTe_2$ is the thermoelectric material, SnTe may preferably be used as a bonding material.

If a bonding material which otherwise may be selected is inherently P or N and is a type opposite to the thermoelectric alloy type, it may create a high resistivity PN or the bonding alloy NP junction within the thermoelectric material. In such an event it should be counterdoped to avoid creating a junction at at this interface. For example, if the thermoelectric device consists of an N-type doped lead telluride thermoelectric material, and it is desired to use tin telluride, which is inherently a P-type material as a bonding material, a quantity of iron which is an N-type dopant should be added to the tin telluride to neutralize it and thereby avoid creating a P–N junction. Up to 40% by atom weight iron may be substituted for the tin. Similarly, germanium telluride which is inherently a P-type material would have to be counter-doped with iron with up to 40% atomic weight of the germanium. It is not necessary oin all cases when counter doping to alloy an impurity with pure bonding material $M_xR_y$ prior to its use. When a contacting electrode containing iron is used and the bonding alloy is first bonded to the electrode at temperatures sufficiently high to melt both the bonding alloy and iron, enough iron may diffuse into the bonding alloy to alter its P or N type characteristics to a satisfactory level. When using this process the iron content of the bonding alloy should be limited to about 40% by atomic weight of the metal in the bonding alloy. Further, this bond requires adherence to the sequential process hereinafter described for forming the bond.

While the relation of coefficients of expansions of the electrode and thermoelectric material is more critical, the bonding material should preferably have a coefficient of expansion close to that of the thermoelectric material. For example, the coefficient of expansion should be in the range of $18\times10^6$ per ° C. for lead telluride.

It is of particular importance that the bonding material have a melting point in the range just below the melting point of the thermoelectric alloy and above the operating temperature of the device. However, it is preferable to select a bonding material which is close to the upper limit of this range. It is desired that the bonding material have a melting point sufficiently below the melting temperature of the thermoelectric material to avoid problems of melting the thermoelectric material during manufacture, but a melting point sufficiently high to avoid diffusion problems of impurities in the bond into the thermoelectric alloy during operation. The temperature range cannot be critically defined due to the uncertainty in the composition of the bond formed. The alloy formed by the bonding material and the thermoelectric material should melt between about 50° C. below the melting temperature of the thermoelectric material and 100° C. above the operating temperature of the device as the lower limit for adequate performance. The bonding material should, generally speaking, melt in a range of 600° C. to 875° C. While these ranges may not be precisely defined they are definitive of a reasonable range. The absolute melting temperature of the bonding material may be varied by the iron content in the contacting electrode, since the iron of the contacting electrode may to some extent diffuse into the bonding alloy. In such case, the bonding material is not a binary system but a ternary system and its melting point should be accordingly determined. Thus, if lead telluride is the thermoelectric material to be bonded to an iron electrode, a lead telluride bonding material may be used provided a sequential process of application is utilized as hereinafter described. In this process the melting temperature of the lead telluride bonding material is lowered at least 50° C. below the lead telluride thermoelectric material as a result of the diffusion of iron into the bonding material.

Of the bonding materials set forth above, germanium telluride and tin telluride have been found particularly useful in bonding P and N type lead telluride to contacting electrodes of iron and low carbon steel. Tin telluride has a melting point of 790° C., and germanium telluride has a melting point of 725° C. which are satisfactorily below the melting point (929° C.) of lead telluride.

In bonding the thermoelectric material to the contacting electrode, the process is accomplished in two stages. In the first state the bonding alloy or material is first bonded to an oxide free contacting electrode and in the second stage the bonding alloy with the attached electrode is bonded to the thermoelectric material. These processes are carried out in a reducing atmosphere to avoid oxidation and consequently high resistivity joints.

The following example is the procedure followed to bond lead telluride to an iron contacting electrode or cap, but is illustrative of the procedure to follow with other materials. First, the iron contacting electrode must be cleaned to remove all traces of oxide films. This may be accomplished by heating the electrode in a hydrogen furnace at a temperature of approximately 1000° C. for an hour. The temperature and time may be varied provided the temperature is below the melting point of the iron but sufficiently high to reduce oxides, and the temperature is maintained for a sufficient time to reduce all oxides. The bonding alloy should then be fused preferably without removing the electrode from the reducing atmosphere to the iron cap as soon as possible after the oxides have been removed. The bonding material comprises a slice of tin telluride, or tin iron telluride (if the lead telluride thermoelectric material is N-type). The iron content of the tin iron telluride may be up to 40% by atomic weight of the tin. The temperature for bonding the bonding alloy to the contacting electrode is significantly higher than the subsequent temperature cycle for bonding the bonding alloy to the thermoelectric material. A temperature cycle of 1000° C. for twenty minutes in a reducing atmosphere in a tin telluride-iron contacting electrode junction is sufficient to form a suitable bond. This time and temperature sequence is not critical, within a wide range, but the temperature should be maintained within a range sufficient to form a suitable bond. Too low a temperature will not assure an integral formation. Too high a temperature will result in a porous bonding alloy. In the case of a tin telluride-iron contacting electrode junction, the process should be maintained between temperatures of 700° C. and 1100° C. Porous bonding alloys are due to vapor formations of the bonding alloy at higher temperatures. The time cycle is also somewhat related. For example, five minutes of exposure to 800° C. temperature is insufficient to allow the alloy to set, while a two hour period of 800° C. is too long because the bonding alloy vaporizes. The reducing atmosphere may be any conventional reducing atmosphere such as hydrogen.

Figure 3:
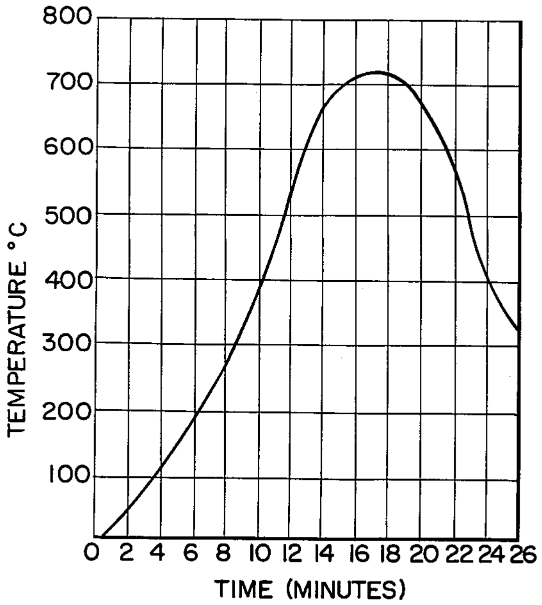
FIG. 3 is a graph of a cleaning temperature cycle.

Prior to bonding the lead telluride thermoelectric material to the tin telluride bonding alloy, the lead telluride is cleaned to remove oxides from its surface, in accordance with a heat cleaning cycle described above in connection with FIG. 3.

Figure 2:
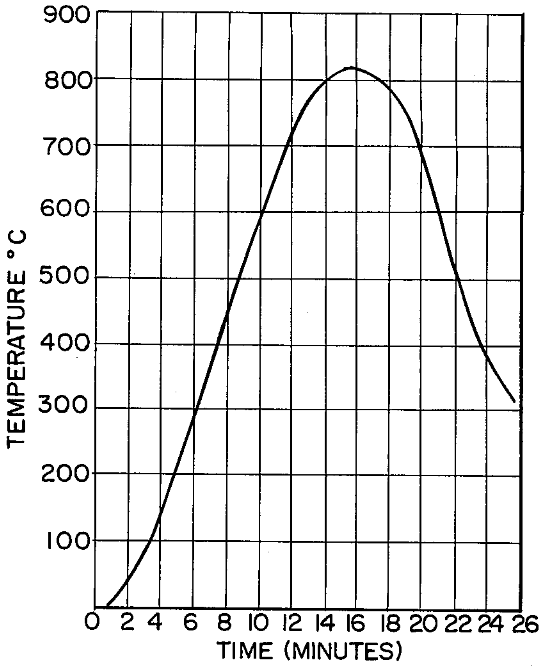
FIG. 2 is a graph of a bonding temperature cycle.
Figure 4:
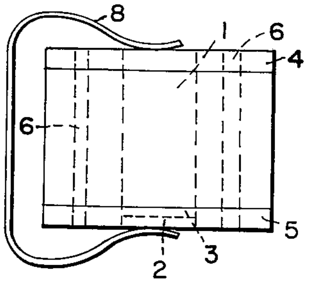
FIGS. 4, 5 and 6 are respectively, side, top and end views of an arrangement used during the bonding of a thermoelectric element to a contacting electrode.
Figure 6:
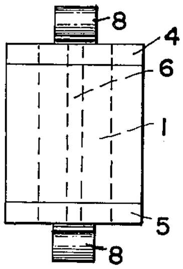
Figure 5:
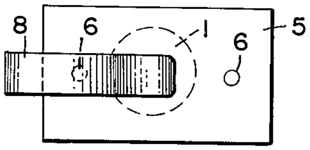

The tin telluride bonding alloy with the contacting electrode attached is then bonded to the thermoelectric lead telluride at a lower temperature. The bonding alloy and thermoelectric material are joined in facing relation under positive pressure in a suitable clamping device, such as illustrated in FIGS. 4, 5 and 6. As illustrated the thermoelectric elements are supported in a frame having upper and lower guide plates 4 and 5 aligned by pins 6 with the thermoelectric elements positioned within holes in the plates 4 and 5 and compressed by a spring 8. The arrangement is placed in a reducing atmosphere of hydrogen or the like and subjected to heat treatment in a temperature cycle such as illustrated in FIG. 2. The temperature should be at least sufficient to melt the bonding alloy and the lead telluride at their interface, but not so high as to cause a substantial diffusion of impurities into the thermoelectric material. In the case of a tin telluride-lead junction, temperatures between 650° C. and 780° C. are sufficient for such purposes. The bonding cycle should also be of sufficient length of time as to cause a satisfactory bond. In the case of a tin telluride-lead telluride junction a bonding time of approximately one hour in the temperature range indicated should be sufficient.

Figure 7:
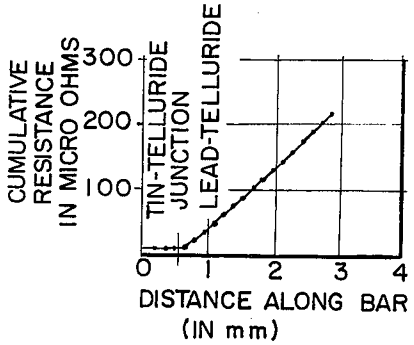
FIG. 7 is a resistance plot across a P-type lead telluride (sodium doped)-tin telluride bonding material junction.
Figure 11:
FIG. 11 illustrates graphically the life test of an N-type (iodine doped) thermoelectric material under typical operating conditions.

FIG. 7 illustrates a resistance plot across a typical lead telluride (sodium doped) P-type thermoelectric material tin telluride bond. It will be noted that the contact resistance is substantially negligible.

Figure 8:
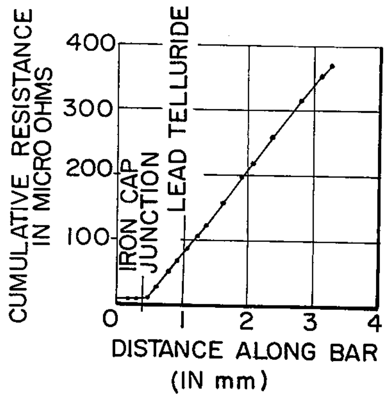
FIG. 8 is a resistance plot across a P-type lead telluride (sodium doped)-tin telluride bonding material-iron contacting electrode bonds.

FIG. 8 illustrates a resistance plot across a lead telluride (sodium doped) P-type thermoelectric material tin telluride-iron contacting electrode bond. Here again the contact resistance is negligible.

Figure 9:
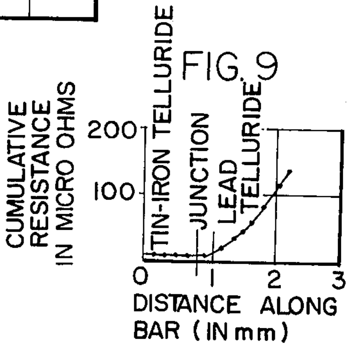
FIG. 9 is a resistance plot across an N-type lead telluride (iodine doped)-tin telluride bonding material junction.

FIG. 9 shows a resistance plot across a lead telluride (iodine doped) N-type thermoelectric material-tin iron telluride bond in which the iron constitutes 40% of the tin by atomic percentage. The contacting resistance is also negligible in this case. Here it will be noted that had pure tin telluride been used it would have formed a high resistance bond, but by using up to 40% of iron in the bonding alloy, the resistivity of the bonding alloy is reduced. While more than 40% iron could be used it is not desirable as the melting point of the bond material becomes increasingly higher with an increased use of iron, as does the vapor pressure.

Figure 10:
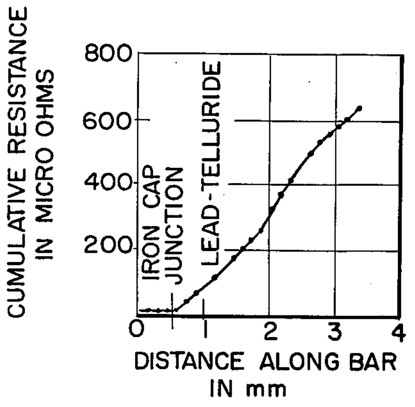
FIG. 10 is a resistance plot across an N-type lead telluride (iodine doped)-tin telluride-iron contacting electrode bond.

In FIG. 10 there is a resistivity plot across an N-type lead telluride (iodine doped) thermoelectric material tin iron telluride bond-iron cap, in which the tin iron telluride has 40% by atomic weight of the tin of iron. The resistance can be seen to be negligible as in the previously mentioned cases. Here, the iron content can be reduced or omitted where a bond is to be made to an iron cap because the iron, soluble in tin telluride, will diffuse into the bonding alloy to satisfactorily counterdope it.

While the foregoing examples have referred to the use of sodium for P-type doping, and iodine for N-type doping of the thermoelectric elements, low resistivity bonds can also be formed where the thermoelectric element is doped with other materials. For example, low resistivity bonds can be formed to tellurium, selenium or sulphur alloys doped with silver to make them P-type, or bismuth to make them N-type.

What is claimed is:

1. In combination with a thermoelectric composition having as its principal constitutents at least one metal selected from the group consisting of
lead,
tin and germanium and at least one metal selected from the group consisting of tellurium,
selenium and sulphur,
and a contacting inert metal electrode selected from the group consisting of iron, steel, nickel, molybdenum, and chromium,
a bonding composition of substantially neutral conductivity comprising a stoichiometric mixture of metallic and nonmetallic elements in essentially stoichiometric proportions wherein said bonding alloy has at least one metal M,
selected from the group consisting of
calcium,
strontium,
barium,
germanium,
tin,
manganese,
beryllium,
vanadium,
ytterbium and zinc and at least one nonmetal R, selected from the group consisting of tellurium, selenium and sulphur,
to form the unique composition $M_n$ $R_n$ having a melting point at least 50° C. below the melting point of the thermoelectric composition, said thermoelectric composition and said electrode being bonded together by said bonding composition to form a bond having negligible contact resistance.

2. A combination as set forth in claim 1, wherein the melting point of said bonding composition is between substantially 600° C. and 875° C.

3. A combination as set forth in claim 2 wherein said metal electrode is iron.

4. A combination as set forth in claim 1 wherein said bonding composition is doped to form a low resistivity interface between said bonding composition and said thermoelectric composition.

5. A combination as set forth in claim 1 wherein said bonding composition is doped with iron up to 40% by atomic weight of said bonding composition metallic element.

6. A combination comprising an inert material forming an electrical bond with a compound semiconductive material, said bond having negligible contact resistance, said semiconductive material having the formula $$A_cB_d$$

where
A is at least one metal selected from the group consisting of lead, tin, germanium, bismuth, antimony, gallium and indium,
B is a nonmetal selected from the group consisting of tellurium, selenium and sulphur when A is lead, tin, germanium, bismuth, or antimony, and when A is gallium or indium, B is selected from the group consisting of antimony and arsenic, and
$c$ and $d$ are whole integers, said inert material being bonded to metallic electrodes with the metal of said electrodes being selected from the group consisting of iron, steel, nickel, molybdenum and chromium,
said inert material comprising, the composition $$M_xR_y$$

where
M is at least one metal selected from the group consisting of calcium, strontium, barium, germanium, tin, manganese, beryllium, vanadium, ytterbium and zinc,
R is a nonmetal selected from the group consisting of tellurium, selenium and sulphur, said composition having a coefficient of expansion close to the coefficient of expansion of said semi-conductive material,
and $x$ and $y$ are whole integers,
said composition $M_xR_y$ comprising a unique mixture, in which $x=c$ and $y=d$ and having a melting point at least 50° C. below the melting point of said semiconductive material.

7. A combination as set forth in claim 6 wherein
$A_cB_d$ is lead telluride, PhTe,
and $M_xR_y$ is tin telluride, SnTe.

8. A combination as set forth in claim 6 wherein
$A_cB_d$ is indium antimide InSb,
and $M_xR_y$ is gallium antimide GaSb.

9. A combination as set forth in claim 6 wherein
$A_cB_d$ is silver antimony telluride, $AgSbTe_2$,
and $M_xR_y$ is tin telluride.

10. A combination as set forth in claim 6 wherein said $M_xR_y$ is tin iron telluride.

11. A combination as set forth in claim 6 wherein M is tin and R is selected from the group consisting of tellurium, selenium and sulphur.

12. A combination as set forth in claim 1 wherein said thermoelectric composition has an electrical conductivity selected from the group consisting of P-type conductivity and N-type conductivity and said bonding composition has the same type conductivity as said thermoelectric composition.

13. A combination as set forth in claim 1 wherein said bonding composition metal is lead.

14. A method of forming a bond between a thermoelectric semiconductive material and a contacting electrode of conductive material,
said semiconductive material having as its principal constituents at least one metal from the group consisting of lead, tin and germanium and at least one element selected from the group consisting of tellurium, selenium and sulphur,
said contacting electrode comprising a metal selected from the group consisting of iron, steel, nickel, molybdenum and chromium,
said method comprising bonding a bonding material to said electrode at a first temperature in excess of the melting point of said bonding material,
said bonding material comprising metallic and nonmetallic elements forming a unique mixture $M_xR_y$, with at least one metal M selected from the group consisting of calcium, strontium, barium, lead, germanium, tin, manganese, beryllium, vanadium, ytterbium, and zinc and at least one non-metal R, selected from the group consisting of tellurium, selenium and sulphur,
said bonding material being such that when said bond to said electrode is effected said bonding material has sufficient thickness to provide a surface spaced from said electrode and electrically compatible with the semiconductor type of said thermoelectric material for permitting said bonding material to form a low resistance bond with said thermoelectric material,
and thereafter bonding said surface to said thermoelectric material at a second temperature lower than said first temperature.

(References on following page)

References Cited by the Examiner

UNITED STATES PATENTS

| | | | |
|---|---|---|---|
| 2,865,794 | 12/1958 | Kroger | 29—472.9 |
| 2,902,529 | 9/1959 | Busanovich | 136—5 |
| 3,017,693 | 1/1962 | Haba | 29—473.1 |
| 3,018,312 | 1/1962 | Cornish | 252—62.3 X |
| 3,031,516 | 4/1962 | Pessel | 136—5 |
| 3,037,064 | 5/1962 | Rosi | 136—5 |
| 3,037,065 | 5/1962 | Hockings | 136—5 |
| 3,045,057 | 7/1962 | Cornish | 136—5 |
| 3,082,277 | 3/1963 | Lane | 136—5 |

FOREIGN PATENTS

| | | |
|---|---|---|
| 766,999 | 1/1957 | Great Britain. |

HYLAND BIZOT, *Examiner.*

DAVID L. RECK, *Primary Examiner.*